United States Patent
Mizouchi et al.

(10) Patent No.: US 6,461,485 B2
(45) Date of Patent: *Oct. 8, 2002

(54) SPUTTERING METHOD FOR FORMING AN ALUMINUM OR ALUMINUM ALLOY FINE WIRING PATTERN

(75) Inventors: Kiyotsugu Mizouchi, Tokyo (JP); Hiroshi Tsuji, Tokyo (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/229,564

(22) Filed: Jan. 13, 1999

(65) Prior Publication Data

US 2001/0009222 A1 Jul. 26, 2001

(30) Foreign Application Priority Data

Jan. 14, 1998 (JP) .......................... 10-006136
Jan. 16, 1998 (JP) .......................... 10-006960
Jan. 16, 1998 (JP) .......................... 10-006961

(51) Int. Cl.$^7$ ............................. C23C 14/34
(52) U.S. Cl. ..................... 204/192.15; 204/192.12
(58) Field of Search ............. 204/192.17, 192.15, 204/192.12, 298.06, 298.08, 298.14; 349/148; 257/765; 211/41

(56) References Cited

U.S. PATENT DOCUMENTS

| | | | |
|---|---|---|---|
| 4,547,279 A | * | 10/1985 | Kiyota et al. .......... 204/192.12 |
| 4,891,112 A | * | 1/1990 | Wong .................... 204/192.15 |
| 4,927,513 A | * | 5/1990 | Schultheiss et al. ... 204/192.13 |
| 5,514,909 A | * | 5/1996 | Yamamoto et al. ......... 257/765 |
| 5,660,700 A | * | 8/1997 | Shimizu et al. ........ 204/298.08 |
| 5,777,710 A | * | 7/1998 | Okada et al. ............... 349/148 |
| 5,823,361 A | * | 10/1998 | Babbs ......................... 211/41 |
| 5,838,409 A | * | 11/1998 | Tomono et al. ............ 349/148 |
| 6,024,844 A | * | 2/2000 | Drummond et al. ... 204/192.12 |

FOREIGN PATENT DOCUMENTS

| JP | 07 045555 A | * | 2/1995 |
|---|---|---|---|
| JP | 8-37186 | | 2/1996 |

OTHER PUBLICATIONS

J.L. Vossen et al. "Thin Film Processes", Academic Press, pp. 131–173, 1978.*

English Abstract of JP 08–037186, Feb. 6, 1996.

* cited by examiner

*Primary Examiner*—Patrick Ryan
*Assistant Examiner*—Gregg Cantelmo
(74) *Attorney, Agent, or Firm*—Oblon, Spivak, McClelland, Maier & Neustadt, P.C.

(57) ABSTRACT

A method of forming a fine wiring pattern by sputtering and patterning which is characterized in that the potential difference between the anode and cathode in the sputtering apparatus is lower than 570V. The resulting fine wiring pattern is free of defects due to splash. This method is effective particularly in the production of array substrates for the flat-panel display device which needs aluminum fine lines to meet the requirement for finer pixels and larger display area.

13 Claims, 17 Drawing Sheets

▨ RANGE IN WHICH SPLASH OCCURRED

SPUTTERING METHOD FOR FORMING AN ALUMINUM OR ALUMINUM ALLOY FINE WIRING PATTERN

BACKGROUND OF THE INVENTION

1. Field of the Invention

The present invention relates to a method of forming a fine wiring pattern to be used in array substrates for flat-panel display devices.

2. Description of the Related Art

A recent movement in the field of electronic display is the replacement of CRT displays by flat-panel displays which are under active development. Among others, liquid crystal display devices are attracting attention because of their advantages of being thin in size, light in weight, and low in power consumption.

They are illustrated below with a liquid crystal display of transmittive, active matrix type having switching elements arranged for individual pixels. This display is composed of an array substrate and a counter substrate, with a liquid crystal layer interposed between them via alignment layers. The array substrate is a transparent insulating substrate of glass, quartz, etc. on which signal lines and scanning lines are arranged in a lattice pattern. Each of their intersections is connected to a thin film transistor (TFT for short hereinafter) which employs semiconductor thin film of amorphous silicon (abbreviated as a-Si:H hereinafter). The TFT has its gate and drain electrodes electrically connected to the scanning and signal lines, respectively, and has its source electrode electrically connected to the transparent electrically conductive material (such as ITO: Indium-Tin-Oxide) constituting the pixel electrode.

The liquid crystal display of active matrix type as mentioned above is widely used for notebook-size personal computers, car navigation systems, and very small TV sets.

For the flat-panel displays to gain wider acceptance in the market, they need higher resolution and larger size.

To achieve the object of improving resolution, it is necessary to reduce the pixel pitch (distance between the centers of adjacent pixels). To maintain a large aperture ratio, it is necessary to form a fine pattern with narrow lines and small line spaces. In this specification, "pixel" denotes a dot of each color (e.g., red, green, and blue) for the color display. In addition, in the case where the pixel pitch differs depending on the vertical and horizontal directions of the display panel, "pixel pitch" denotes the smaller one.

For a 20-inch (diagonal) monitor to meet the UXGA specification (1600×3×1200 pixels), it is necessary that the pixel pitch be about 0.25 mm. In this case, the smallest wiring width and the smallest wiring space (space between adjacent wiring patterns) should be less than about 30 $\mu$m and 100 $\mu$m, respectively, so that a satisfactory aperture ratio is secured for efficient light utilization. Also, for a 20.8-inch (diagonal) monitor to meet the QUXGA specification (3200×3×2400 pixels), it is necessary that the pixel pitch be about 0.132 mm and the wiring width be less than 15 $\mu$m.

On the other hand, in order to increase the size of a display panel while reducing the wiring width, it is necessary to make the wiring from a low-resistance metal which does not deteriorate the waveform being transmitted. Aluminum is known to meet this requirement.

Unfortunately, conventional technologies present difficulties with deposition by sputtering of a metal layer with uniform thickness because sputtering causes metal particles to stick to the metal layer, resulting in minute defects. Such particulate foreign matter (splash) on the metal layer leads to defective wiring after patterning if it is larger than 5 $\mu$m in diameter and the wiring width is smaller than 30 $\mu$m or the wiring space is smaller than 60 $\mu$m. How splash is formed is schematically shown in FIG. 18.

The occurrence of splash by sputtering is more frequent in the case of aluminum than in the case of molybdenum which has been commonly used for liquid crystal display devices. Splash of aluminum remarkably increases if aluminum is incorporated with neodymium to protect the aluminum layer from hillocks (bulging due to heat process), as proposed in JP-A-07 045555 (1995) (Japanese Patent Laid-open No. 45555/1995).

One way to prevent hillocks when an aluminum layer is formed by sputtering is to carry out sputtering in an argon atmosphere at 3–50 mTorr (0.4–6.7 Pa), preferably about 10 mTorr (1.3 Pa), according to JP-A-08 037186 (1996) (Japanese Patent Laid-open No. 37186/1996). It is claimed that sputtering in this way gives rise to aluminum alloy containing 0.1–6.5 atom % argon because the aluminum layer takes up argon. However, it was found that it is impossible to prevent splash simply by carrying out sputtering in an argon atmosphere at a specific pressure.

SUMMARY OF THE INVENTION

The present invention was completed to address the above-mentioned problem. Accordingly, it is an object of the present invention to provide a method of forming a fine wiring pattern by sputtering and patterning without causing defects due to splash.

The gist of the present invention resides in a method of forming a fine wiring pattern which includes a first step of depositing by sputtering on an insulating substrate a thin film of aluminum or alloy containing more than 70 atom % aluminum and a second step of patterning said thin film, thereby forming a fine wiring pattern, wherein said sputtering is carried out under the condition that the potential difference between the anode and the cathode is lower than 570V. Sputtering in this way does not cause wiring defects due to splash.

According to one embodiment of the invention, the fine wiring pattern has a wiring width smaller than 30 $\mu$m or a wiring space smaller than 60 $\mu$m.

According to another embodiment of the invention, the fine wring pattern is formed from an aluminum alloy containing neodymium (Nd), yttrium (Y), and/or gadolinium (Gd) in a total amount of 0.3–5.0 atom %. Sputtering in this way prevents the occurrence of hillocks and wiring defects due to splash.

According to further another embodiment of the invention, thin film is deposited on a substrate placed in a reaction chamber by DC sputtering. This process comprises a step of detecting a decrease in the cathode-anode voltage, thereby detecting the occurrence of arc discharge, a step of cutting off power supply to apply voltage across the cathode and anode within 1 $\mu$s after the occurrence of arc discharge, and a step of resuming power supply and sputtering within 5–15 $\mu$s after said power cut-off.

The advantage of this embodiment is that it is possible to prevent the occurrence of splash due to arc discharge, thereby improving the yields of array substrates, and it is also possible to greatly reduce downtime that is required for operation to resume after the maintenance of the sputtering chamber has been completed.

According to still further another embodiment of the invention, thin film is deposited on substrates by DC sputtering in such a way that a prescribed sputter voltage is applied across the target electrode and the substrate and a sputter magnet is moved back and forth parallel to the target electrode. This process is characterized in that the sputter magnet is moved vertically with respect to the target electrode, thereby adjusting the distance between the sputter magnet and the target electrode, so as to decrease fluctuation in the sputter voltage when it is detected that the sputter voltage has changed from its reference voltage.

The advantage of this embodiment is that it is possible to easily keep the sputter voltage constant and hence it is possible to eliminate wiring defects due to splash and to form thin film with uniform quality. In the case of DC sputtering apparatus provided with a mechanism to move the sputter magnet back and forth to form thin film on a large substrate, it is possible to prevent the sputter voltage from increasing due to the action of the shield screening the periphery of the target. This leads to thin film of uniform quality.

The DC sputtering apparatus used in this embodiment consists of a treating chamber for substrate treatment, a target electrode arranged in said treating chamber, a sputter magnet so supported as to move back and forth parallel to said target electrode, a voltage detecting means to detect sputter voltage, a mechanism to move said sputter magnet vertically with respect to said target electrode, thereby adjusting the distance between said sputter magnet and said target electrode, and a mechanism to reduce fluctuation in said sputter voltage by adjusting the distance between said sputter magnet and said target electrode.

The DC sputtering apparatus used in another embodiment consists of a treating chamber for substrate treatment, a target electrode arranged in said treating chamber, shelf-like shields which are arranged near the periphery of said target electrode so as to prevent plasma from impinging on said target electrode, a sputter magnet so supported as to move back and forth parallel to said target electrode, a mechanism to move said sputter magnet vertically with respect to said target electrode, thereby adjusting the distance between said sputter magnet and said target electrode, and a mechanism to reduce the distance between said sputter magnet and said target electrode when said sputter magnet is positioned in the region where said target electrode is screened by said shelf-like shield.

DETAILED DESCRIPTION OF THE PREFERRED EMBODIMENTS

The invention will be described with reference to the following example which is designed to produce an array substrate for the liquid crystal display device of active matrix type. The example employs the sputtering apparatus and method illustrated in FIGS. 1 to 3.

Figure 1:
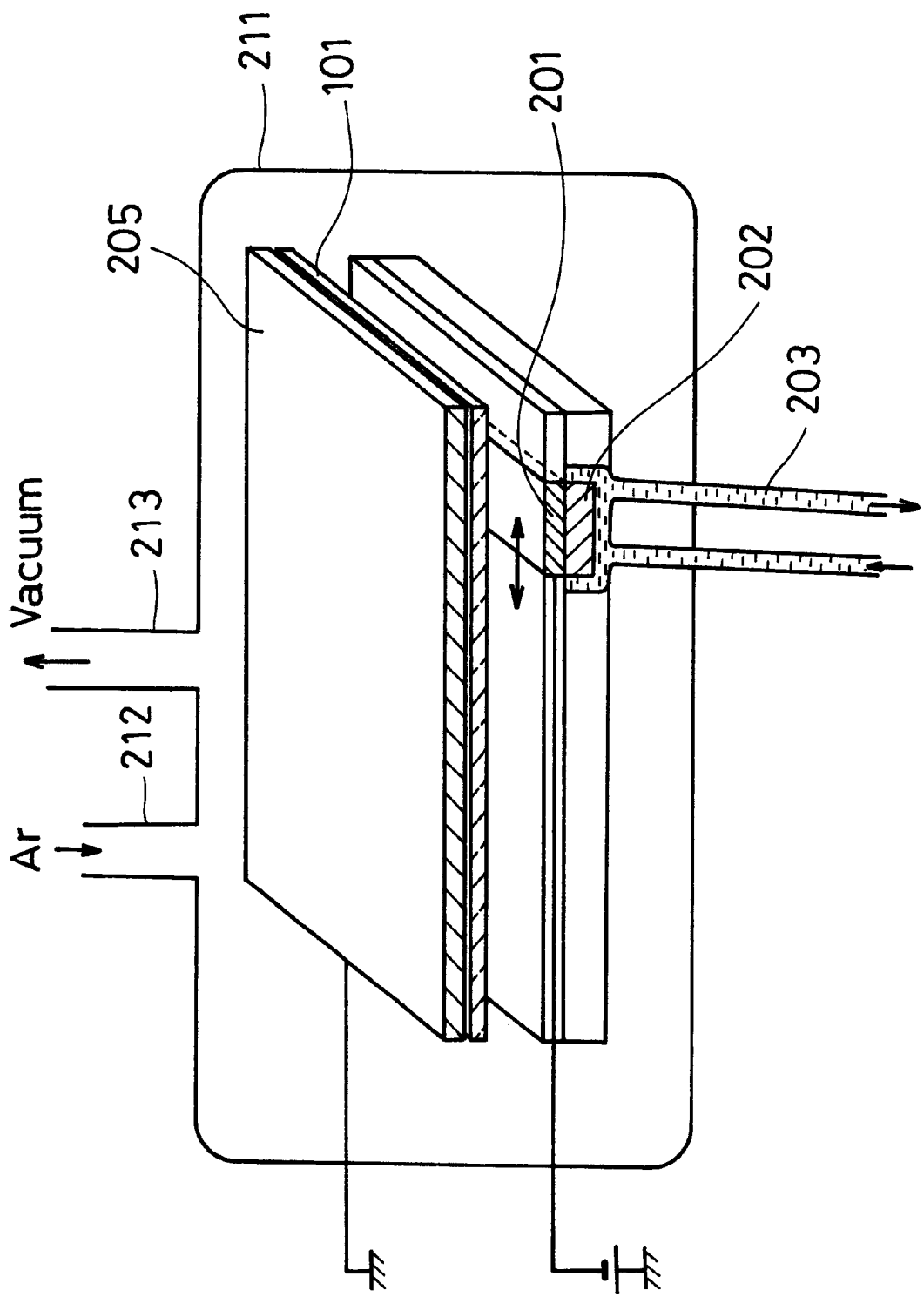
FIG. 1 is a schematic sectional view showing the sputtering apparatus used in Example.

The sputtering apparatus shown in FIG. 1 is a DC magnetron sputtering apparatus for large-area substrates (Model SHD450 made by Nippon Shinkuu Gijutsu Co., Ltd.). It has two electrodes facing to each other. The first electrode (201) is flat and made of target material and is provided underneath with a sputter magnet (202) consisting of a permanent magnet and an electromagnet. There is a cooling water passage (203) in contact with the first electrode (201) and the sputter magnet (202) which prevents them from getting excessively hot during sputtering.

Above the first electrode (201), the second electrode (205) which holds a glass substrate (101) is disposed to be opposite to the first electrode (201). The sputtering chamber (211) is evacuated through a vacuum line (213) and is supplied with argon (Ar) gas through a gas inlet (212). The pressure in the sputtering chamber (211) is controlled by properly balancing evacuation with gas introduction. The large-area glass substrate (101) is arranged such that a uniform metal film is deposited entirely over its lower surface. The first electrode (201) sweeps the lower surface of the glass substrate (101) through the sputtering region over it.

The first electrode (201) is made of an aluminum-neodymium (Al—Nd) alloy containing 2 atom % neodymium. That is, the molar number of contained neodymium atoms is 2% of the total molar number of atoms composing the alloy. This alloy is abbreviated as Al—Nd (2 atom % Nd) hereinafter.

Using the above-mentioned apparatus, the above-mentioned glass substrate underwent sputtering so that a 100–400 nm thick film of Al—Nd (2 atom % Nd) was deposited to cover its one side entirely. The resulting deposited film was examined under a microscope to count the number of particles (splash), larger than 5 μm in diameter, sticking to it. The relation between the sputtering condition and the occurrence of splash is graphically shown in FIGS. 2 and 3.

Figure 2:
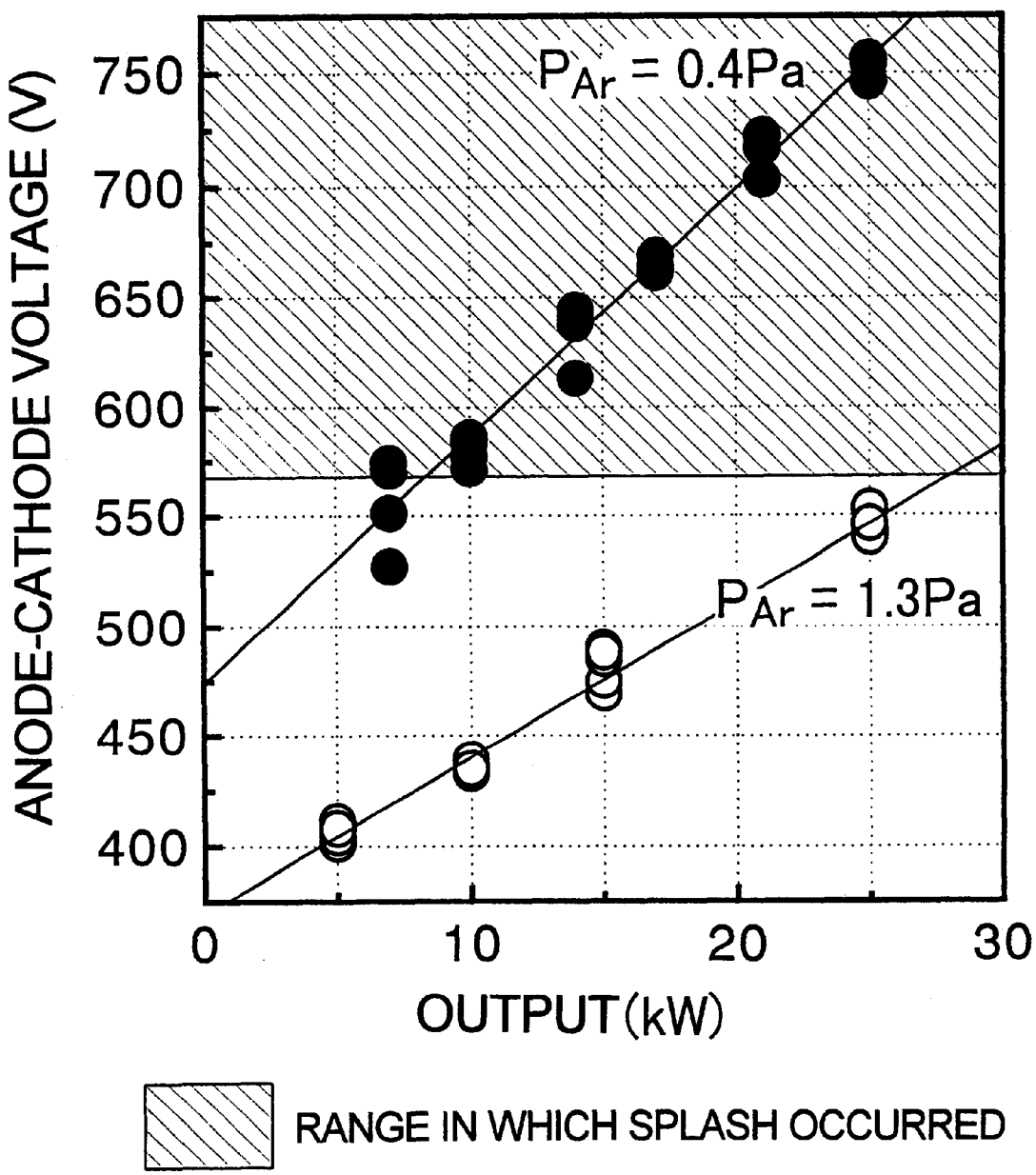
FIG. 2 is a graph showing the relation between the frequency of the occurrence of splash and the anode-cathode voltage of the sputtering apparatus.

In FIG. 2, the frequency of the occurrence of splash is plotted against the anode-cathode voltage or the voltage across the first electrode (201) and the second electrode (205). The number of splash was counted for 6–9 glass substrates (12 inches diagonal) at each voltage and expressed in terms of the range per square centimeter. The pressure of argon gas was varied from 0.4 to 1.3 Pa at each voltage.

The sputtering was carried out under the conditions shown below.

TABLE 1

Figure 3:
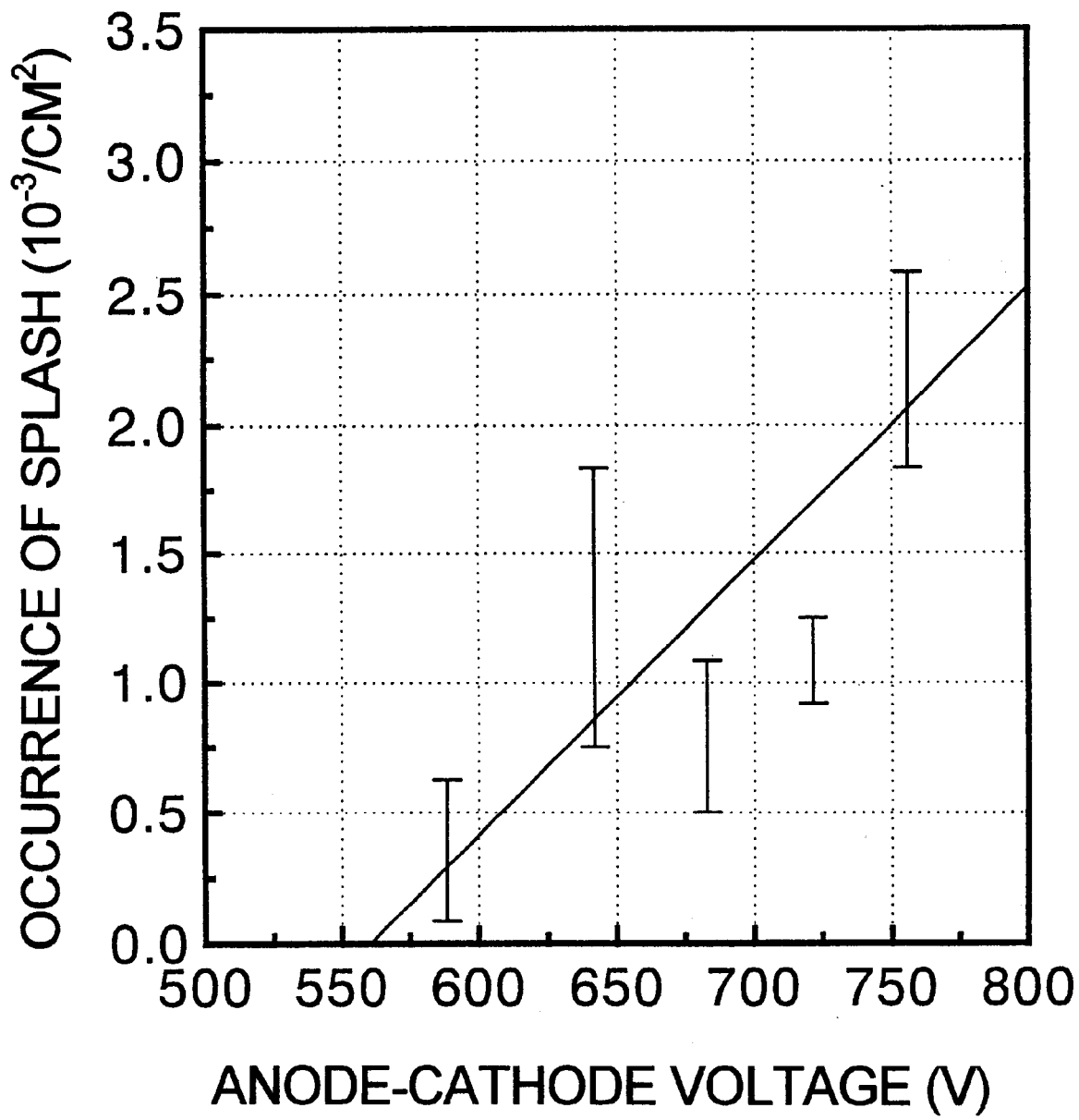
FIG. 3 is a graph showing the relation between the output and the anode-cathode voltage of the sputtering apparatus.

Conditions of sputtering to give data in FIGS. 2 and 3

| | |
|---|---|
| Size of the glass substrate (101) | 300 × 400 mm |
| Size of the first electrode (201) | 120 × 570 mm |
| Distance between the first electrode (201) and the glass substrate (101) | 70 mm |
| Distance between the first electrode (201) and the sputter magnet (202) | 55 mm |
| Magnetic flux density at the surface of the sputter magnet (202) | 200 Gauss |
| Power density | 22 W/cm$^2$ |
| Current density in the neighborhood of the first electrode (201) | 1.6 × 10$^{-3}$ ~ 2.83 × 10$^{-3}$ A/cm$^2$ |

It is noted from FIG. 2 that there is an apparent positive correlation between the number of splashes and the anode-cathode voltage and that there are very few splashes in the region where the anode-cathode voltage is lower than 570V.

FIG. 3 shows the relation between the output of the sputtering apparatus and the anode-cathode voltage. Sputtering was carried out at an argon pressure of 0.4 or 1.3 Pa, with the output of the sputtering apparatus varied over a range from 5 to 25 kW. All the data obtained when sputtering was performed on 4–8 glass substrates are plotted because the anode-cathode voltage fluctuates at the same output. The upper hatched area in the graph represents the range in which splash occurred. It is noted that in the case of argon pressure at 0.4 Pa, splash occurred at an output as low as 10 kW, whereas in the case of argon pressure at 1.3 Pa, splash did not occur at an output as high as 25 kW.

The output of the sputtering apparatus is approximately proportional to the rate at which the metal film is deposited by sputtering if the output is in the range shown in the figure. The sputtering apparatus used in this example gives a deposition rate satisfactory for commercial production at the output of about 20 kW or above.

It is known from the results in FIG. 3 that it is possible to completely prevent splash while depositing the metal film at a sufficiently high rate if the anode-cathode voltage is kept lower than 570V and the pressure of the argon atmosphere is kept high.

When the pressure of the argon atmosphere was higher than 1.3 Pa, a sufficiently high output of about 25 kW was achieved in the region where no splash occurred. (This is not shown in the figure.) On the other hand, when the pressure of the argon atmosphere exceeds 1.4 Pa, the deposited metal film is poor in compactness.

The above-mentioned sputtering apparatus and method were applied to the production of an array substrate for the display device. This is explained with reference to FIGS. 4 and 5.

Figure 4:
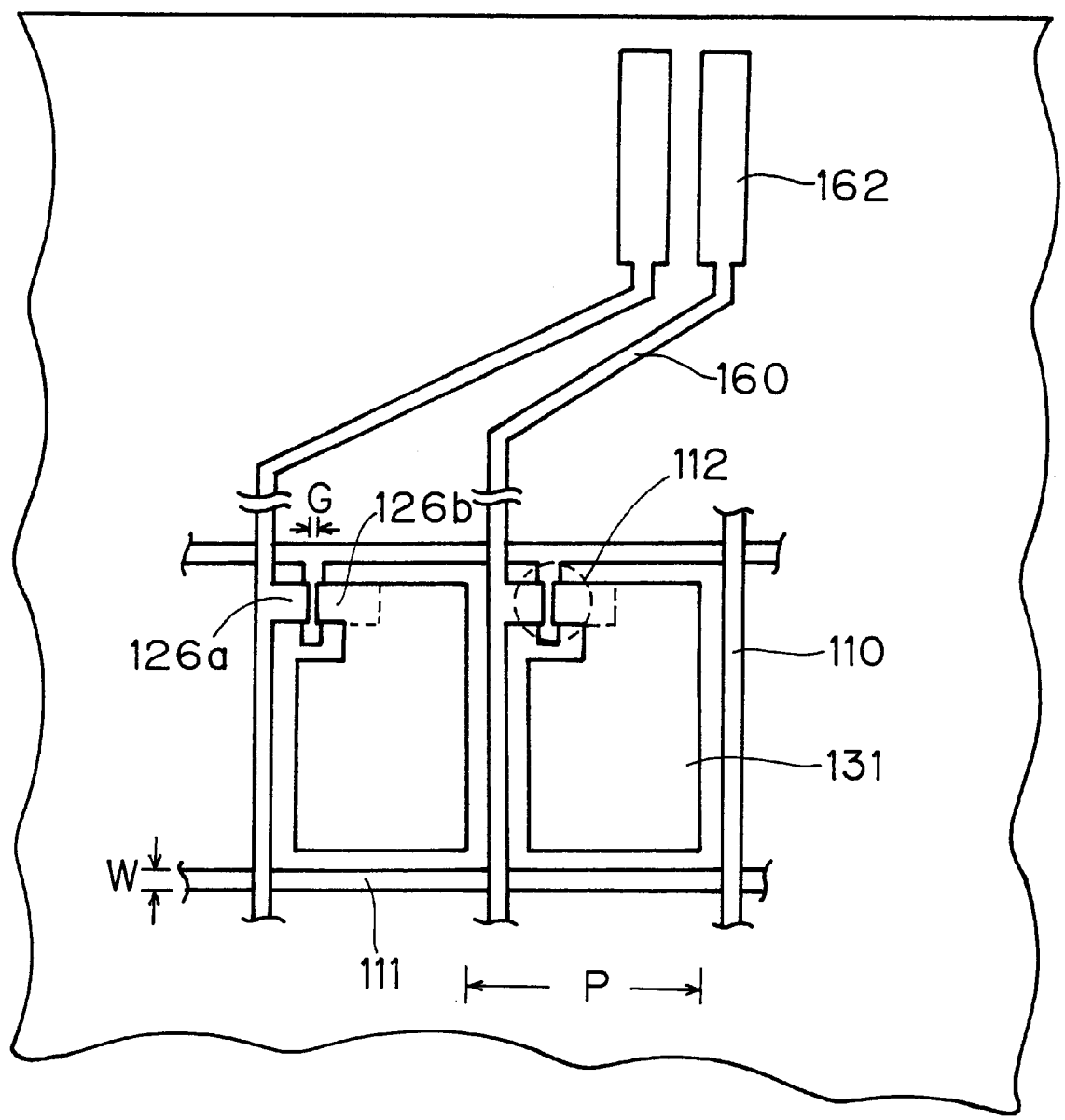
FIG. 4 is a partly enlarged plan view schematically showing the fine wiring pattern on the array substrate for the display device.
Figure 5:
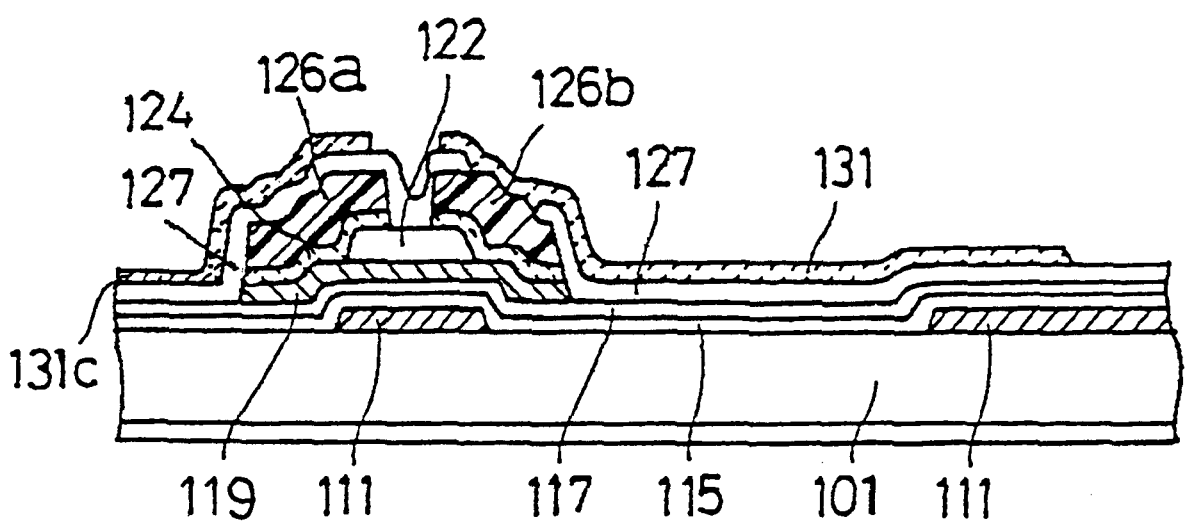
FIG. 5 is a vertical sectional view schematically showing the multi-layer structure in the TFT forming region on the array substrate for the display device.

FIG. 4 is a schematic plan view showing the array substrate (100) for the liquid crystal display device. The lower side of the figure is positioned at the upper side of the screen of the liquid crystal display device. The scanning lines are sequentially selected from the lower side to the upper side in the figure. FIG. 5 is a vertical sectional view schematically showing the multi-layer structure of the TFT (112) formed on the array substrate.

The array substrate (100) measures 20 inches (diagonal) and has 1200 scanning lines (111) arranged thereon. One end of each scanning line (111) is led to one side of the glass substrate (101) and electrically connected to the scanning line pad via the oblique wiring part.

The array substrate (100) has 4800 signal lines (110) perpendicular to the scanning lines (111) formed on the glass substrate (101). Each signal line (110) is led to the other side of the glass substrate (101) and electrically connected to the signal line pad (162) via the oblique wiring part (160). Incidentally, the scanning line (111) is a metal film composed mainly of aluminum, and the signal line (110) is a metal film of three-layer structure, with the first to third layers being composed mainly of molybdenum, aluminum, and molybdenum, respectively.

The TFT (112) is arranged in the neighborhood of the intersection of the scanning line (111) and the signal line (110). The TFT (112) is connected to the pixel electrode (131) of ITO which is formed on the interlayer insulating film (127) covering the scanning lines (111) and the signal lines (110).

The scanning lines (111) and the signal lines (110) have a width (W) of 4–30 μm, and the TFT (112) has a gap (G) of 4–25 μm between the source electrode (126b) and the drain electrode (126a). The pixel pitch (P) is 0.083 mm.

This array substrate is produced by the process consisting of seven steps as fully explained below with reference to FIG. 5.

(1) The First Step

The process starts with performing sputtering on a glass substrate (101) which has been coated with SiO$_x$ film by plasma CVD. This sputtering is intended to deposit a 300 nm thick film of Al—Nd (2 atom % Nd) and a 50 nm thick film of Mo using the above-mentioned sputtering apparatus. The Al—Nd alloy may be replaced by Al—Y (2 atom % Y), Al—Gd (2 atom % Gd), or Al—Sc (2 atom % Sc). These aluminum alloys will give wiring with sufficiently low resistance if their aluminum content is higher than 70 atom %; they also prevent hillocks completely if the content of their alloying element such as Nd is 0.3–5 atom %.

Thus formed two-layer film undergoes patterning by photolithography for the scanning lines and the auxiliary capacitor wiring and then etching with a mixture of phosphoric acid, acetic acid, and nitric acid. This etching gives an etched surface inclined less than 35 degrees. (Primary patterning)

(2) The Second Step

With the glass substrate (101) heated to 300° C. or above, the following four films are formed thereon consecutively by atmospheric pressure plasma CVD for the first and by low pressure plasma CVD for the second to fourth.

(i) The first gate insulating film (115) of silicon oxide ($SiO_x$), 175 nm thick.

(ii) The second gate insulating film (117) of silicon nitride, 175 nm thick.

(iii) The semiconductor coating film (119) of a-Si:H, 50 nm thick.

(iv) The channel protective film (122) of silicon nitride, 200 nm thick.

The film forming process is carried out without exposure to the atmosphere.

(3) The Third Step

The channel protective film (122) undergoes patterning by back exposure technique, with the scanning lines (111) used as the self-alignment mask. It also undergoes patterning by exposure through a second mask pattern corresponding to the TFT region, and ensuing development and pattern formation. Patterning is followed by chemical dry etching with a mixture gas of tetrafluorocarbon and oxygen. In this way the island-like channel protective film (122) is formed. (Secondary patterning)

(4) The Fourth Step

The exposed surface of the semiconductor film (119) is treated with a solution of hydrofluoric acid (HF) so that it has good ohmic contact. On the treated surface, a 30 nm thick low-resistance semiconductor film (124) is deposited by plasma CVD, which semiconductor film is made of n⁺ a-Si:H containing phosphorus as an impurity. On the semiconductor film, a 300 nm thick three-layer film (125) is further deposited by the above-mentioned sputtering apparatus and method. The three-layer film (125) is composed of a first layer of Mo, a second layer of Al—Nd (2 atom % Nd), and a third layer of Mo. Al—Nd may be replaced by Al—Y containing 0.3–5.0 mol % of Y, as explained in the first step.

(5) The Fifth Step

The three-layer film (125) undergoes patterning by exposure through a third mask pattern, development, and wet etching. The low-resistance semiconductor film (124) and the semiconductor film (119) undergo patterning by plasma etching with the etch selectivity properly controlled for the first gate insulating film (115) or the second gate insulating film (117) and the channel protective film (122). Patterning in this way integrally forms the source electrode (126b), the drain electrode (126a), and the island-like part of the low-resistance semiconductor film (124) under them. (Tertiary patterning)

(6) The Sixth Step

A 200 nm thick interlayer insulating film (127) of silicon nitride is deposited.

(7) The Seventh Step

A 100 nm thick ITO film is deposited by sputtering. The ITO film undergoes patterning by exposure through a fourth mask, development, and dry etching. In this way the pixel electrode (131) is formed. (Quaternary patterning)

The above-mentioned process gave the array substrate for the display device which is free from wiring defects due to splash even in the case where the wiring width is smaller than 30 μm and the pixel pitch is smaller than 0.25 mm.

The same result as the above-mentioned example may be obtained even if argon as the atmosphere gas is replaced by krypton (Kr) or neon (Ne).

The condition used in the above-mentioned process is merely exemplary; the inventors found that the same effect as above is obtained under different conditions as partly exemplified below.

TABLE 2

| Sputtering conditions | | |
|---|---|---|
| Size of the glass substrate (101) | 360 × 465 mm | 550 × 650 mm |
| Size of the first electrode (201) | 120 × 530 mm | 120 × 900 mm |
| Distance between the first electrode (201) and the glass substrate (101) | 70 mm | 70 mm |
| Distance between the first electrode (201) and the sputter magnet (202) | 55 mm | 38 mm |
| Magnetic flux density at the surface of the sputter magnet (202) | 200 Gauss | 200 Gauss |
| Power density | 24 W/cm² | 36 W/cm² |

The First Modified Example

Figure 7:
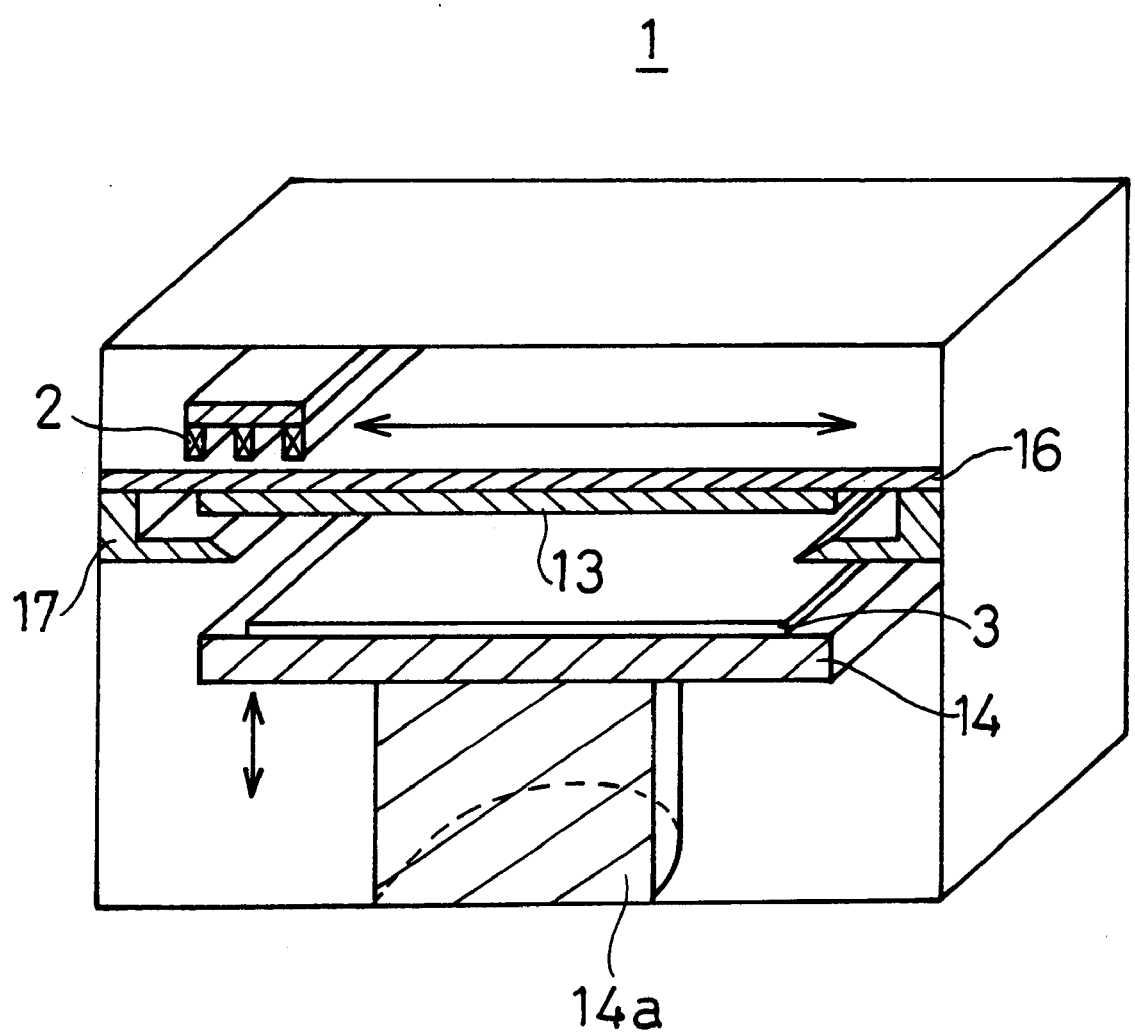
FIG. 7 is a vertical perspective sectional view schematically showing the basic structure of the sputtering chamber pertaining to the first modified example.
Figure 8:
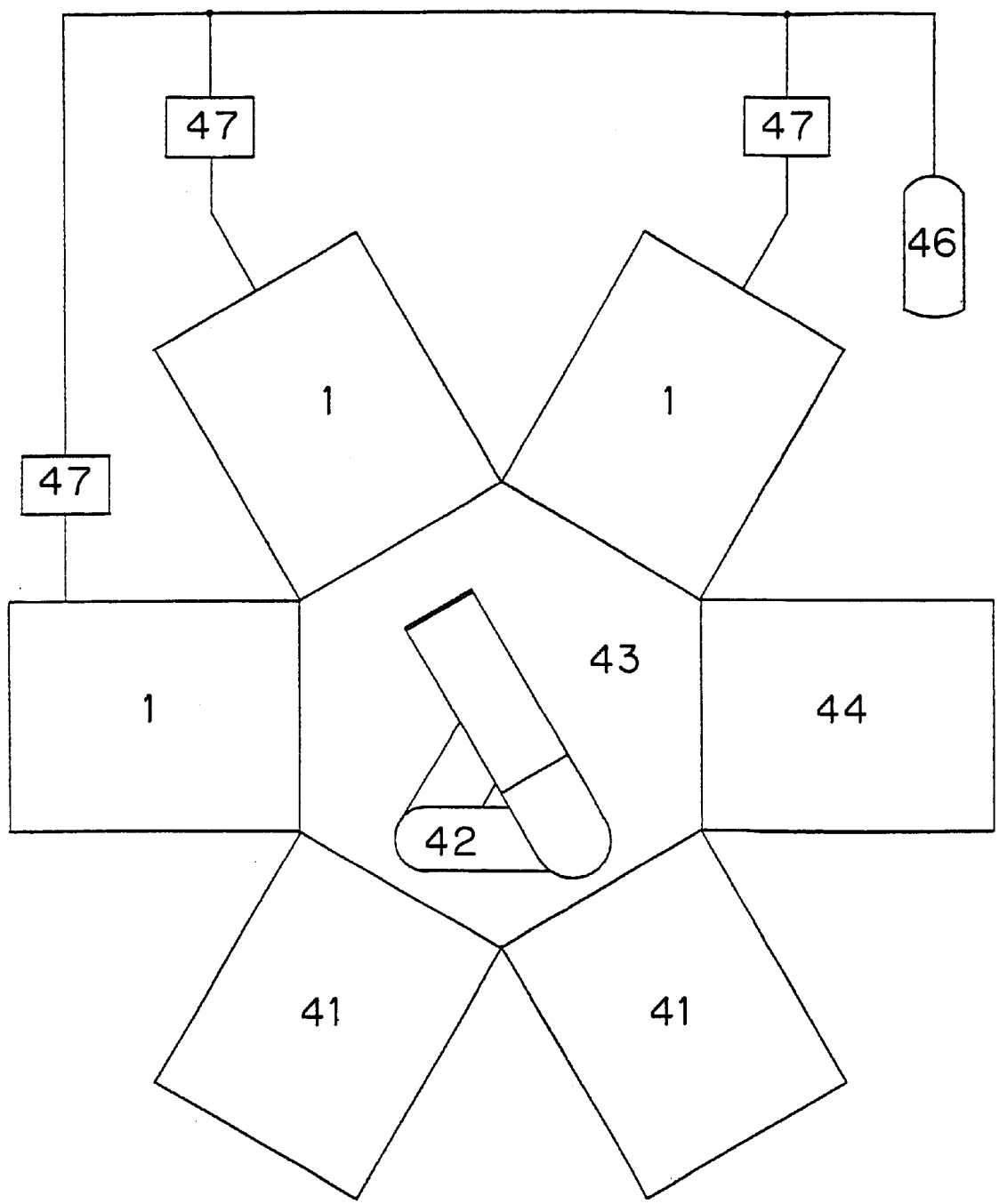
FIG. 8 is a plan view schematically showing the layout of the sputtering apparatus and its auxiliary equipment pertaining to the first modified example.

The above-mentioned example may be modified as explained below with reference to FIGS. 6 to 13 and Tables 3 to 5. This modified example employs the DC sputtering apparatus of magnetron type as shown in FIGS. 6 to 8.

Figure 6:
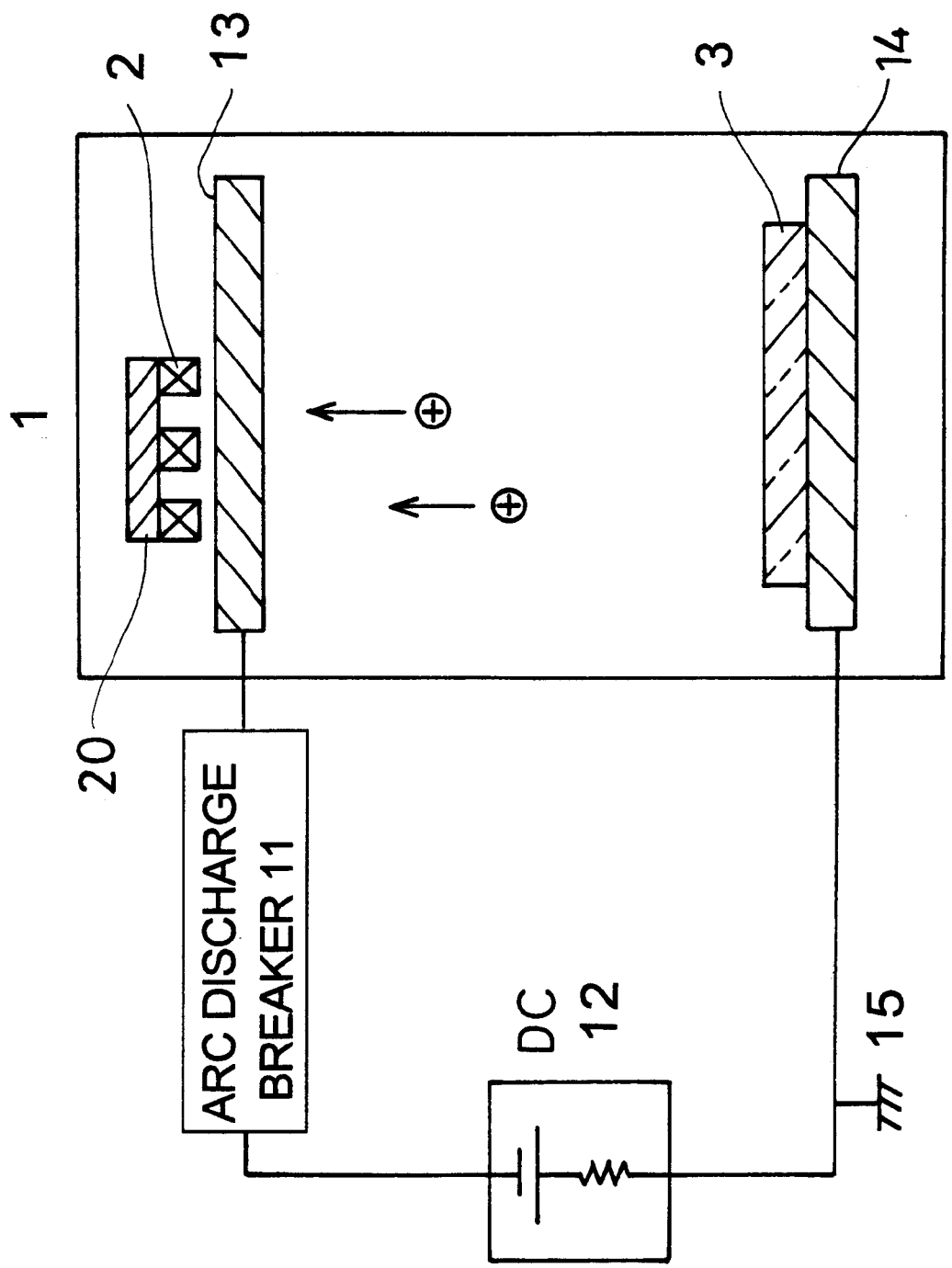
FIG. 6 is a conceptual diagram schematically showing the basic structure and wiring of the sputtering chamber of the sputtering apparatus used in the modified example.

FIG. 6 is an extremely simplified schematic wiring diagram for the sputter chamber of the DC sputtering apparatus. The sputter chamber (1), which is a vacuum chamber, contains argon (Ar) as the sputter gas at a reduced pressure of 0.6 Pa. It holds a pair of electrodes (13, 14) facing each other, which are connected to a DC power source (12). Upon application of voltage across the paired electrodes (13, 14), plasma is generated on the surface of the first electrode (13) by magnetron discharge resulting from the action of the sputter magnet (2). This plasma ionizes the argon gas, and the resulting positive ions are accelerated by the electric field and caused to impinge upon the first electrode (13). This results in the target atoms being sputtered to form a thin film on the substrate (3). In this modified example, the DC power source (12) applies a voltage of about 550V across the anode and the cathode during normal sputtering. The DC power source (12) has its positive electrode connected to the ground wire (15).

The DC power source (12) is connected to the electrodes (13, 14) in the sputter chamber via the arc discharge breaker (11), which consists of (i) a voltmeter to detect the surge voltage or a rapid increase in the anode-cathode voltage (sputter voltage) that occurs when arc discharge starts, (ii) a circuit breaker to cut off power supply rapidly whenever the surge voltage is detected, and (iii) a circuit to resume power supply after a prescribed period of time.

The process in this example is designed such that power supply is cut off within 1 μs after the occurrence of voltage anomaly (or arc discharge) and resumed within 5–15 μs after power cut-off.

FIG. 7 is a vertical sectional perspective view schematically showing the basic structure of the sputter chamber (1). There are shown the second electrode (14) and the glass substrate (3) placed thereon. There is also shown the first electrode (13) which is a flat plate arranged opposite to the glass substrate (3). The first electrode (13) has approximately the same area as the glass substrate (3).

The sputter magnet (2) in the illustrated apparatus consists of three square rods fastened to the underside of a horizontal beam. The sputter magnet (2) moves laterally back and forth (as indicated by arrows) during sputtering so as to ensure uniform film deposition on the glass substrate (3) of large area (550×650 mm in this modified example). In this modified example, the sputter magnet (2) is 55 mm away from the first electrode (13).

The first electrode (13) is welded to the copper backing plate (16). The first electrode (13) and the backing plate (16) have their peripheral parts covered by a shelf-like shield (17). This shield (17) prevents ions from impinging upon the backing plate (16), thereby protecting the thin film from contamination with copper. Moreover, the shield (17) prevents the sputter material of the first electrode (13) from depositing on the backing plate (16). Deposition will peel off, giving rise to dust particles.

The sputtering chamber (1) is designed to process the glass substrate (3) one by one for film deposition. The second electrode (14) is supported by a vertically movable cylinder (14a) so that it is moved downward when the glass substrate (3) is mounted on and dismounted from it.

The sputtering apparatus has six rectangular chambers arranged around a hexagonal transfer room (43) shown in FIG. 8. Two of the six chambers are load-lock chambers (41), one is the preheating chamber (44), and three are the sputtering chambers (1). Each chamber is separated from the transfer room (43) by a partition wall provided with a port for the substrate to pass through.

All of the transport room (43), preheating chamber (44), and sputtering chambers (1) are kept at the same degree of vacuum; therefore, glass substrates are brought in and out through evacuation procedure or vacuum-relieving procedure (reversion to atmospheric pressure) at the load-lock chamber (41). Plural glass substrates (3) loaded on a cassette are moved as a unit into the load-lock chamber (41) from outside, and are moved out from the chamber to the outside. Each sputtering chamber (1) is supplied with argon (as sputtering gas) from a gas cylinder (46) via a flow controller (47). The transport room (43) is provided with a robot arm (42) which passes the glass substrate (3) from the load-lock chamber (41), through the preheating chamber (44), and the sputtering chamber (1), and again to the load-lock chamber (41) sequentially. In this modified example, the glass substrate is heated to 200° C. in the preheating chamber (44) and then transferred to the sputtering chamber (1).

Using the above-mentioned DC sputtering apparatus, sputtering was performed on a glass substrate measuring 550×650 mm to form thereon a 300 nm thick film of molybdenum-tungsten alloy (Mo—W film containing 50 wt % molybdenum) or a 300 nm thick aluminum film (Al film). The resulting thin film was examined for the number of splash. The results are shown in Table 3. For reference, the same procedure as above was repeated except that the arc discharge breaker was not used.

TABLE 3

Number of splash (per substrate)

| | Modified example | Referential example |
| --- | --- | --- |
| Arc discharge breaker | Yes | No |
| Thin film | | |
| Mo-W film | 0.9 | 2.1 |
| Al film | 0.3 | 0.9 |

It is noted from Table 3 that the arc discharge breaker contributes to the remarkable decrease in the number of splash in both Mo—W film and Al film.

Figure 9:
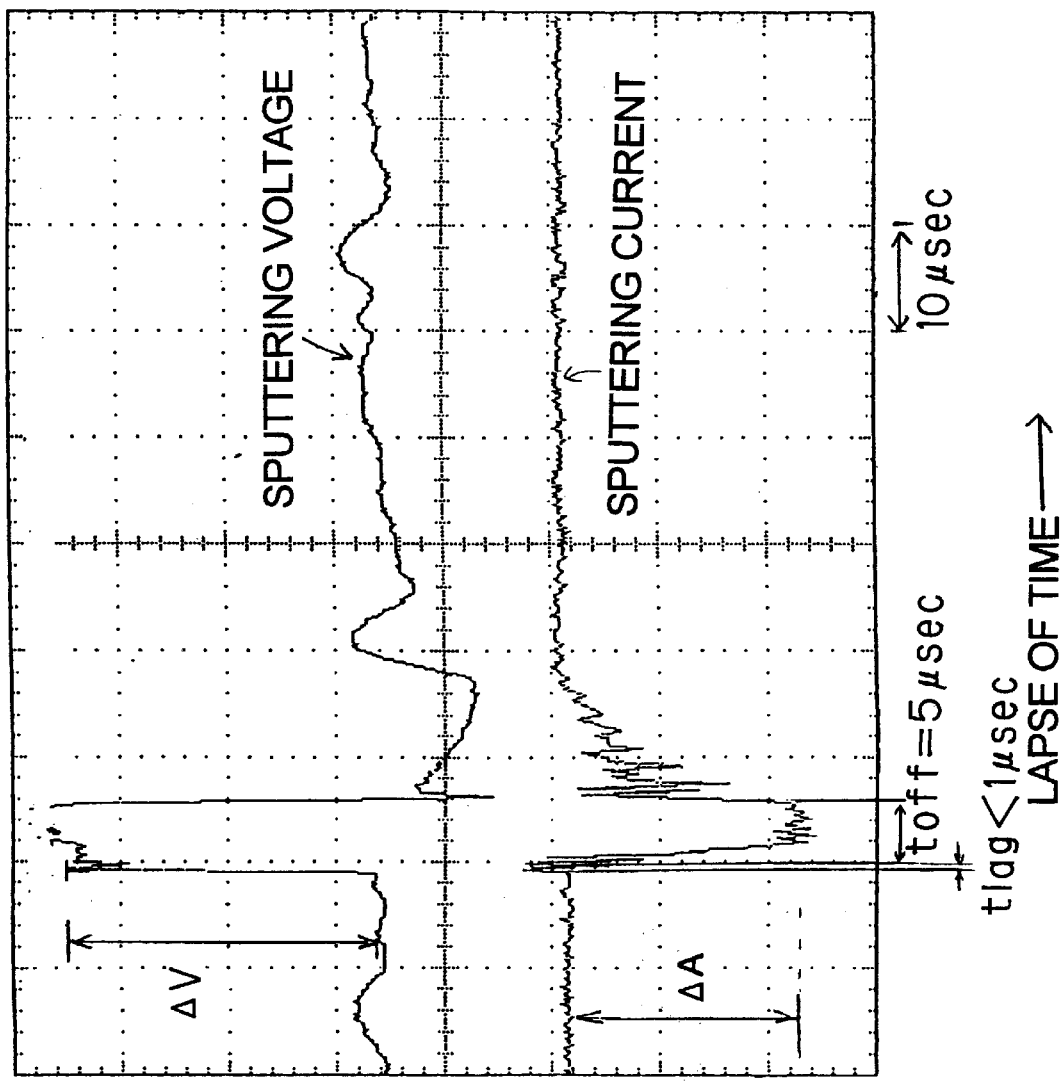
FIG. 9 is a chart showing the sputtering voltage and sputtering current (across the anode and cathode) which change with time when arc discharges occur in the sputtering apparatus pertaining to the first modified example.
Figure 10:
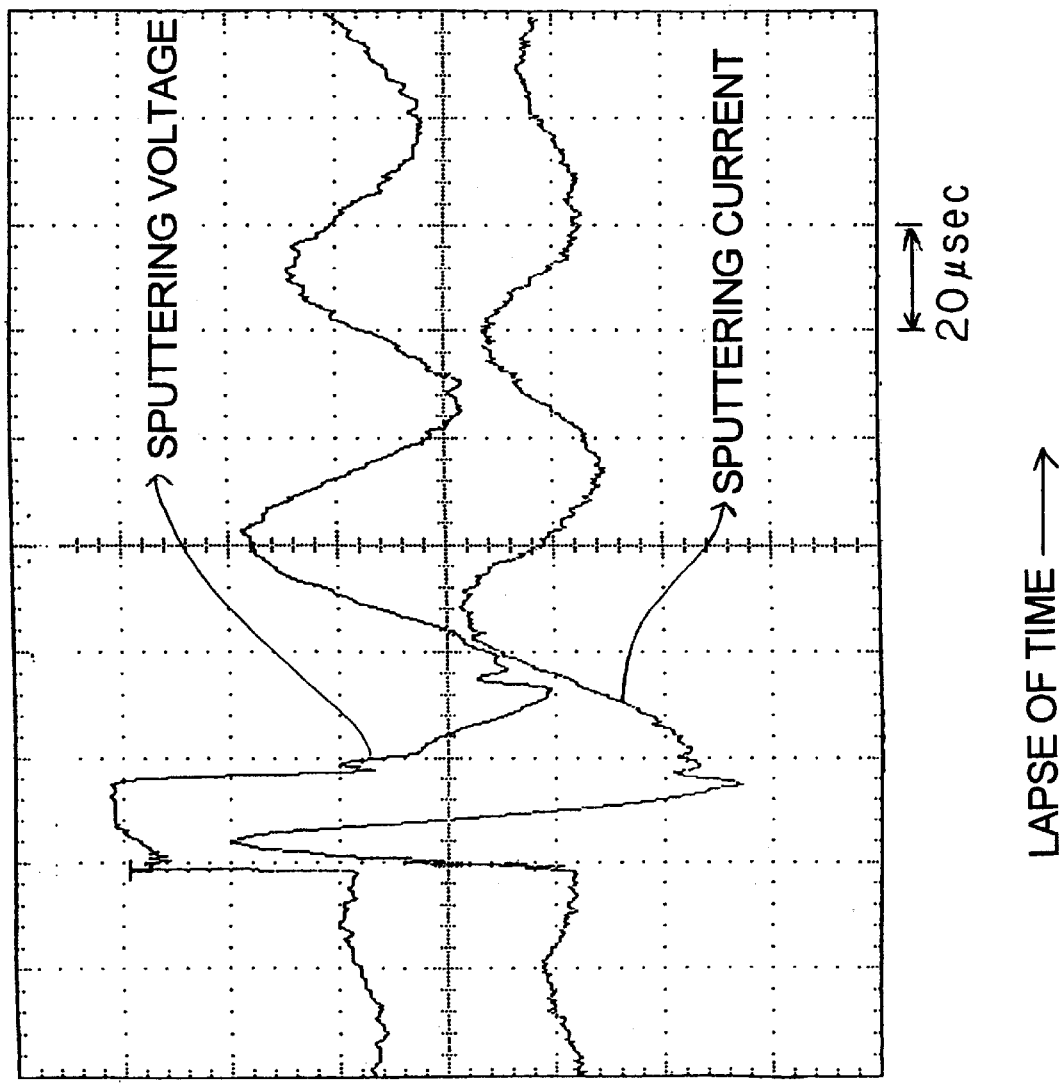
FIG. 10 is a chart showing the sputtering voltage and sputtering current (across the anode and cathode) which change with time when arc discharges occur in the sputtering apparatus without power circuit breaker pertaining to the comparative example.

The formation of Mo—W film in the modified example and referential example is accompanied by the sputter voltage and sputter current (anode-cathode current) which change with time after the occurrence of arc discharge as shown in FIGS. 9 and 10. In the modified example shown in FIG. 9, the sputter voltage (absolute value) rapidly decreases when arc discharge occurs. (The voltage decrease is shown as a speed increase in the cathode potential which is set negative.) Within 1 μs after this, power supply is cut off and hence the sputter current decreases rapidly. After 5 μs of cut-off, power supply is resumed. Within 15 μs after this, the sputter current becomes stable. In the referential example shown in FIG. 10, the sputter current fluctuates giving peaks due to arc discharge and remains unstable even 100 μs after the completion of arc discharge.

Figure 11:
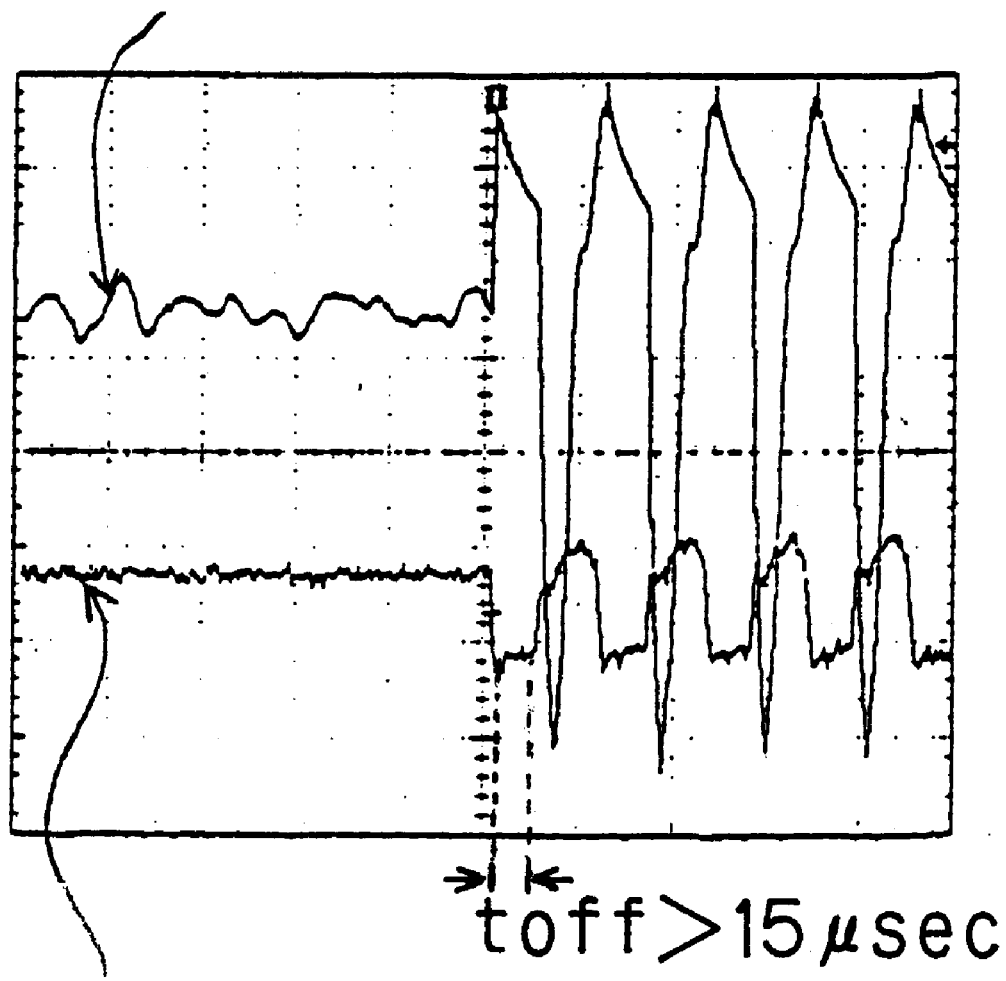
FIG. 11 is a chart showing the sputtering voltage and sputtering current (across the anode and cathode) which change with time when arc discharges occur in the comparative example in which arc discharges are interrupted for about 15 $\mu$s.

For comparison, Mo—W film was formed in the same manner as above except that the cut-off time for arc discharge was adjusted to about 15 μs. The results are shown in FIG. 11. It is noted that the sputter voltage and sputter current remained unstable even 100 μs after the completion of the first arc discharge because arc discharge occurred repeatedly for the period of 15 μs.

In another experiment in which power supply was cut off for less than 4 μs, it took a long time for the sputter current to become stable, as arc discharge or the like occurred again, presumably because arc discharge do not come to a complete end in the cut-off time. This result is not graphically shown.

In the case where power cut off is delayed for 1 μs or more after the occurrence of arc discharge, the number of splash per substrate increases in proportion to delay. A probable reason for this is that arc discharge reaches its peak during this period. The delay in power cut off resulted in the sputter current taking a long time to become stable after the resumption of power supply.

The same result as in this modified example was obtained when argon as the atmosphere gas was replaced by krypton (Kr).

As shown in Table 4, the procedure according to this modified example allows a saving on the pre-sputtering process which includes cleaning the target electrode surface of contamination such as oxide film and adsorbed water after periodic maintenance such as replacement of target electrode and pre-sputtering to stabilize the target surface.

TABLE 4

Saving on pre-sputtering process

| | This modified example | Referential example |
| --- | --- | --- |
| Arc discharge breaker | Yes | No |
| Number of glass substrates required (*1) | 90 | 200 |
| Down time (*2) | 3.8 h | 8 h |

(*1) The number of glass substrates for pre-sputtering required for the number of particles (smaller than 5 μm in diameter) to decrease below 30.
(*2) Time required for regular production (film deposition) to start after periodic maintenance.

It is noted from Table 4 that the DC sputtering apparatus according to this modified example needs about 90 glass substrates before regular operation starts for Al film with less than 30 particles smaller than 5 μm in diameter. By contrast, the sputtering apparatus without arc discharge breaker in comparative example requires about 200 glass substrates. The reduction in the number of glass substrates required for pre-sputtering leads to a great reduction in the time (down time) required for resuming a film-forming operation for producing goods after periodic maintenance. Down time in this modified example is 3.8 hours, whereas down time in comparative example is 8 hours.

The improved operation efficiency in the sputtering process leads to a great reduction in production cost per substrate.

Array substrates for the display device were produced according to the process of this example as explained below with reference to FIGS. 12 and 13 and Table 5.

Figure 12:
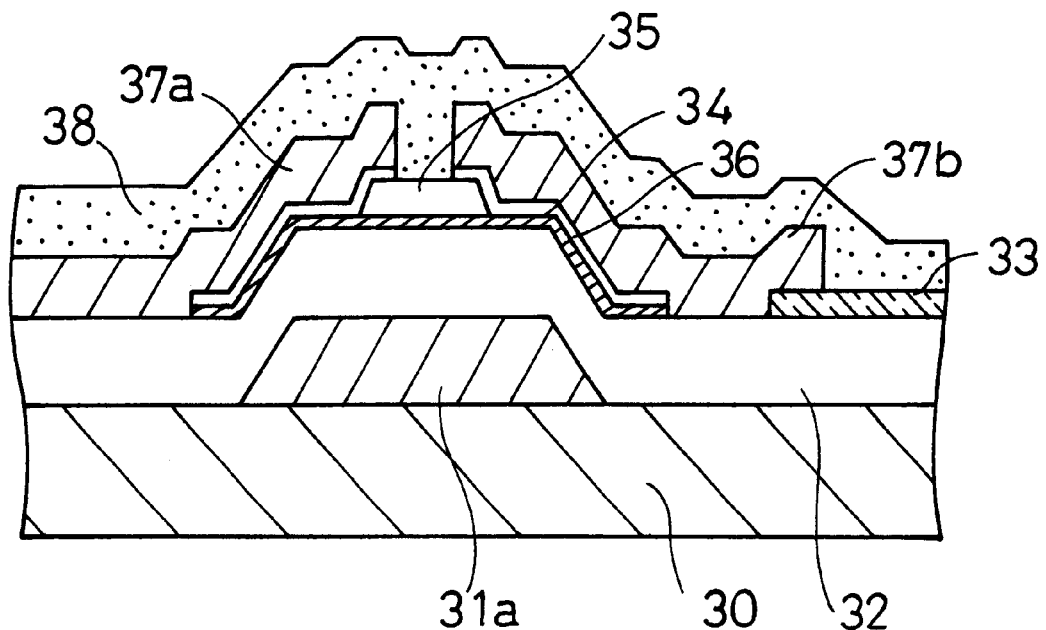
FIG. 12 is a vertical sectional view schematically showing the multi-layer structure in the TFT forming region on the array substrate.
Figure 13:
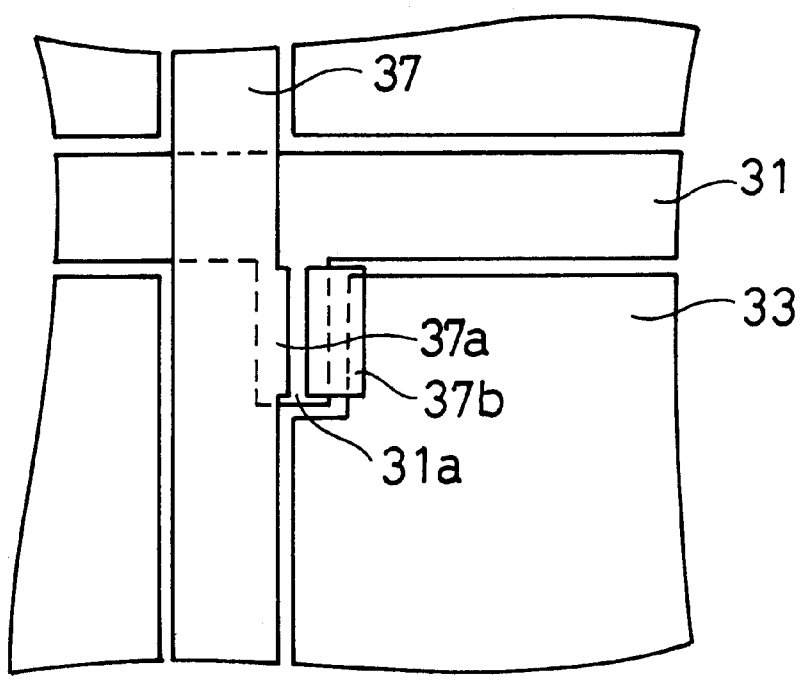
FIG. 13 is a schematic plan view showing the surrounding of the multi-layer structure in the TFT forming region on the array substrate.

The array substrate has TFT's formed thereon, each having the layer structure as schematically shown in FIG. 12 which is a vertical sectional view. The surrounding of each TFT region is schematically shown in FIG. 13 which is a plan view.

The array substrate is produced by the process consisting of six steps as explained below in detail.

(1) The First Step

The process starts with performing sputtering on a glass substrate (30), measuring 550×650 mm, which has been coated with $SiO_x$ film by plasma CVD, to deposit a 300 nm thick Mo—W film as mentioned above. Thus formed film undergoes patterning (by photolithography) for the scanning lines and gate electrodes, followed by chemical dry etching (CDE) to give a step-forming slope inclined about 30 degrees so that the gate electrode, its step-forming slope in particular, is covered by the insulating film satisfactorily. (Primary patterning)

(2) The Second Step

A 300 nm thick gate insulating film (32) of silicon oxide ($SiO_x$) is formed by plasma CVD. Then, a 50 nm thick semiconductor film (34) of a-Si:H and a 200 nm thick channel protective film (35) of silicon nitride are formed consecutively without exposure to the atmosphere.

(3) The Third Step

The channel protective film (35) undergoes patterning by back exposure technique, with the scanning lines (31) used as the self-alignment mask. It also undergoes patterning by exposure through a second mask pattern corresponding to the TFT region, and ensuing development and pattern formation. In this way the island-like channel protective film (35) is formed. (Secondary patterning)

(4) The Fourth Step

The exposed surface of the semiconductor film (34) is treated with a solution of hydrofluoric acid (HF) so that it has good ohmic contact. On the treated surface is deposited by plasma CVD a 30 nm thick low-resistance semiconductor film (36) of $n^+$ a-Si:H containing phosphorus as an impurity.

(5) The Fifth Step

A 100 nm thick ITO film is deposited by sputtering. The ITO film undergoes patterning by exposure through a third mask, development, and dry etching. In this way the pixel electrode (33) is formed. (Tertiary patterning)

(6) The Sixth Step

Using the above-mentioned sputtering apparatus and method, a three-layer film (37) is deposited, which is composed of a first film (50 μm thick) of molybdenum (Mo), a second film (350 μm thick) of aluminum (Al), and a third film (50 μm thick) of molybdenum (Mo). Thus formed three-layer film undergoes patterning by exposure through a fourth mask and ensuing development to form the source electrode (37*a*) and the drain electrode (37*b*). (Quaternary patterning) Finally, the alignment layer (38) is formed over the entire surface.

The array substrate obtained as mentioned above was examined for percent defective. The results are shown in Table 5.

TABLE 5

Percent defective of array substrate

|  | Modified example | Referential example |
|---|---|---|
| Arc discharge breaker | Yes | No |
| Percent defective due to interlayer shorts (*1) | 1.2% | 1.7% |
| Percent defective due to common shorts (*2) | 1.5% | 2.0% |

(*1) Between the conductive layer including the gate electrode and the conductive layer including the drain electrode.
(*2) Electrical contact with the common electrode on the opposite substrate.

It is noted from Table 5 that the array substrate in this example is improved over that in referential example in which the arc discharge breaker is not used, in percent defective due to interlayer shorts between the gate electrode and the drain electrode. (Reduction from 1.7% to 1.2%) It is also noted that the array substrate in this example is improved over that in referential example in percent defective due to common shorts that occur after the array substrate has been assembled into a liquid crystal display panel together with the sealing material, counter electrode substrate, and liquid crystal. (Reduction from 2.0% to 1.5%)

The Second Modified Example

Figure 14:
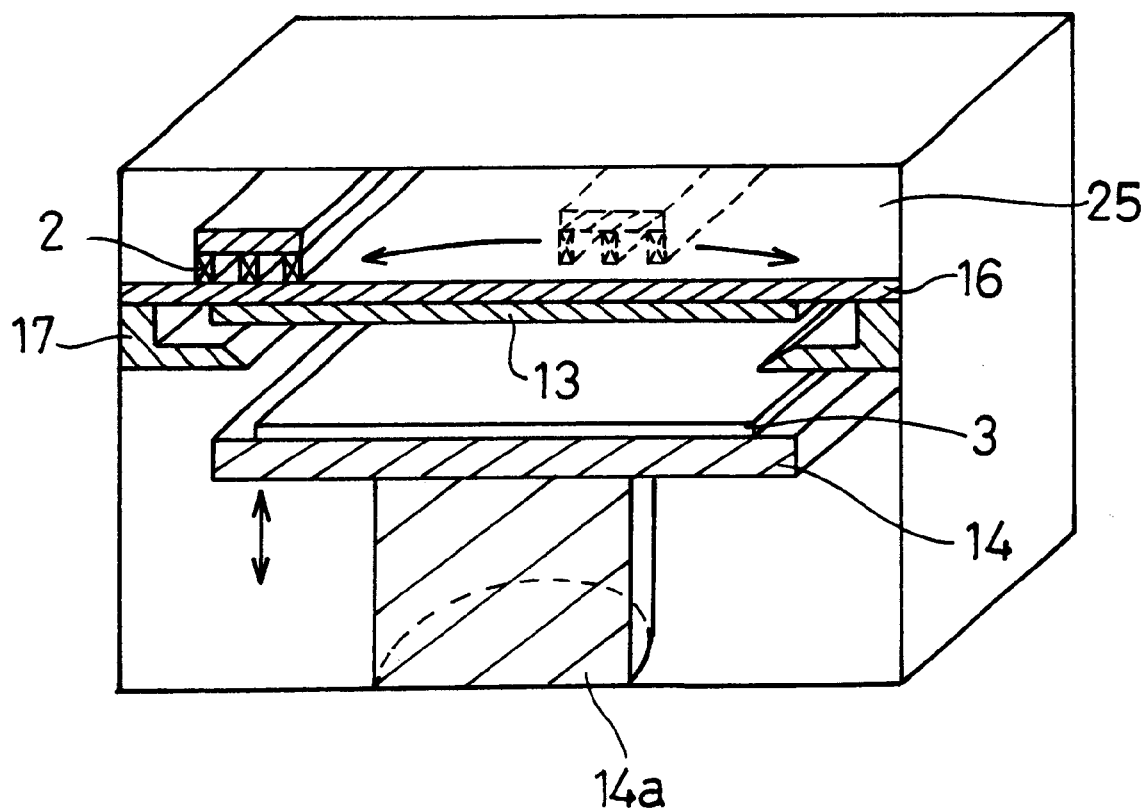
FIG. 14 is a vertical sectional perspective view showing the basic structure of the sputtering chamber in the DC magnetron sputtering apparatus used in the second modified example.

The second modified example of the invention will be described below with reference to FIGS. 14 to 17. This modified example employs the DC magnetron sputtering apparatus which has the sputtering chamber as shown in FIG. 14 (schematic perspective view in vertical section).

The sputtering chamber (1) is provided with the second electrode (14) which functions as the substrate holder to support the glass substrate (3) of large area (550×650 mm) on which a thin film is deposited. The sputtering chamber (1) is also provided with the first electrode (13) which is welded to the lower surface of the backing plate (16). Above the sputtering chamber (1) is the magnet room (25), in which, during sputtering, the sputter magnet (2) moves laterally rightward and leftward as indicated by arrows and also moves vertically such that it comes down when it approaches the shelf-like shields at the ends of reciprocal movement and goes up as it leaves them.

This vertical movement of the sputter magnet (2) is intended to keep the discharge impedance constant. Without this provision, the discharge impedance increases as the sputter magnet (2) approaches the ends where it is screened by the shield (17) and hence the plasma area is decreased. The increase in discharge impedance is cancelled by bringing down the sputter magnet (2) toward the target electrode (3). This mechanism completely eliminates the fluctuation in sputtering voltage even when the power applied across the anode and the cathode in the sputtering chamber (1) is controlled by the constant power control system.

The construction of the sputtering chamber (1) is identical with that explained above with reference to FIG. 7 in the first modified example, except that the sputter magnet moves vertically as mentioned above.

Figure 15:
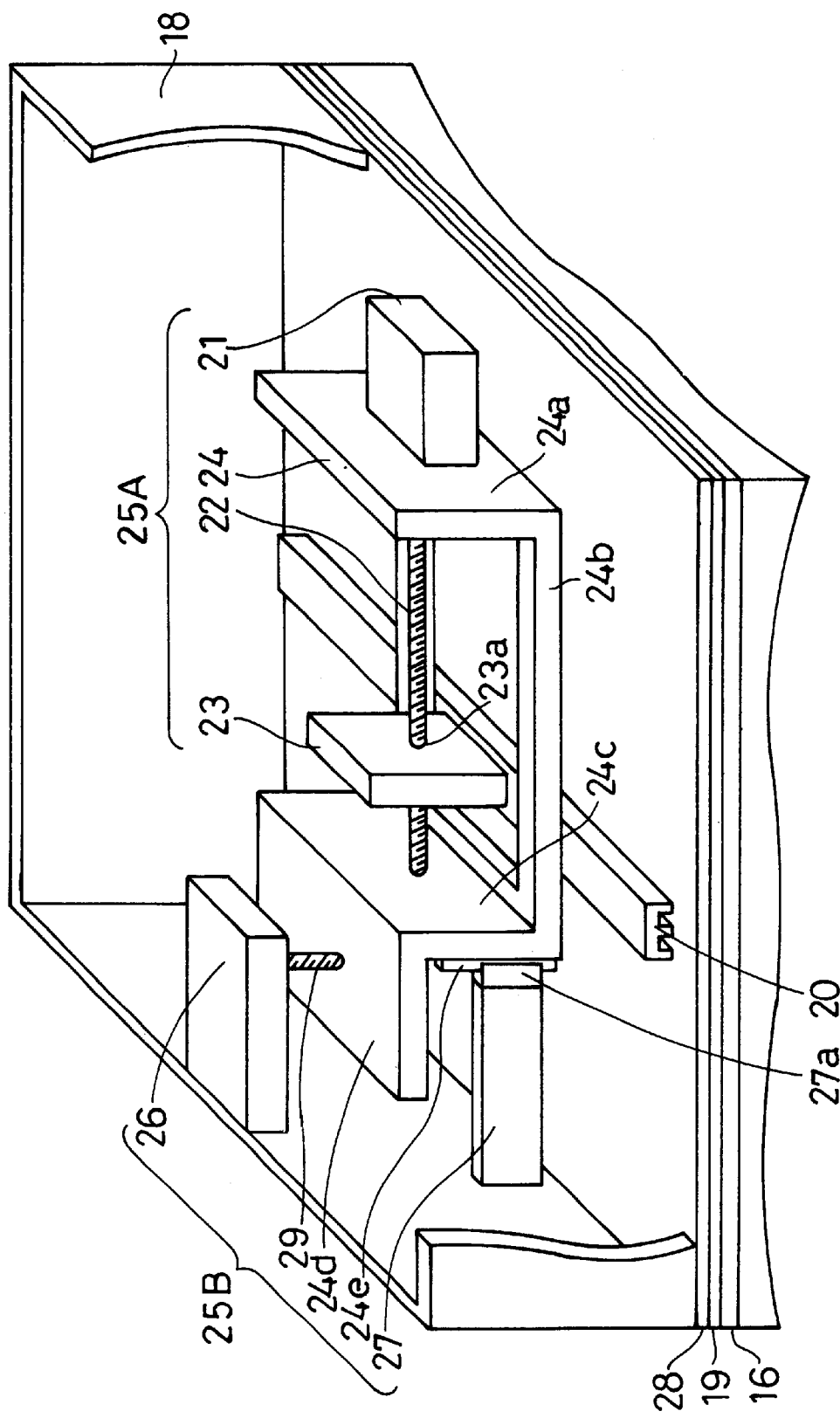
FIG. 15 is a cut-away perspective view schematically showing the upper part of the sputtering chamber which is provided with a mechanism to move the sputtering magnet both vertically and horizontally, in the second modified example.

The magnet room (25) above the sputtering chamber (1) is shown in FIG. 15 which is a cut-away perspective view. It houses the mechanism to reciprocate the sputter magnet horizontally and vertically. What is shown in FIG. 15 is the part above the backing plate (16) to which the first electrode (13) is fastened. The backing plate (16) is covered with a Teflon insulating plate (19) and a bottom plate (28) for the magnet room (25). The bottom plate (28) is formed integrally with the cathode cover (18) which constitutes the side wall and ceiling of the magnet room (25).

The sputter magnet (2) is fixed to the magnet supporting beam (20), which is suspended from the cathode cover (18) via the support drive mechanism consisting of two gadgets (25A and 25B), the former reciprocating the magnet (2) horizontally and the latter moving the magnet (2) vertically.

The gadget (25A) for horizontal movement consists of a servo motor (21), a horizontal screw shaft (22) directly connected thereto, a vertically movable frame (24) to support them, and a magnet supporting plate (23) which has at its center a screw hole (23a) to engage with the horizontal screw shaft (22). The magnet supporting plate (23) has its lower side fixed to the upper side of the magnet supporting beam (20), so that the magnet supporting beam (20) is suspended from the horizontal screw shaft (22).

The vertically movable frame (24) consists of three members: (i) a right vertical plate (24a) to support the right end of the horizontal screw shaft (22), (ii) a left vertical plate (24c) to support the left end of the horizontal screw shaft (22), and (iii) a hollow frame (24b) to connect the lower ends of the vertical plates (24a, 24c) to each other.

The magnet supporting plate (23) moves leftward or rightward as the servo motor (21) runs to turn the horizontal screw shaft (22). Accordingly, the magnet supporting beam (20) also moves, with its upper surface sliding on the front and rear portions of the hollow frame (24b).

The gadget (25B) for vertical movement consists of a servo motor (26) fixed to the cathode cover (18), a vertical screw shaft (29) directly connected thereto, and a horizontal plate (24d) of the vertically movable frame, said horizontal plate having at its center a screw hole to engage with the vertical screw shaft (29).

The horizontal plate (24d) is connected at its right end to the upper end of the left vertical plate (24c).

The vertically movable frame (24) moves up and down as the servo motor (26) runs to turn the vertical screw shaft (29).

Thus, the mechanism in the magnet room is such that one vertical screw shaft (29) holds all of the vertically movable frame (24), the gadget (25A) for horizontal movement, the sputter magnet (2), and the magnet supporting beam (20), and the vertically movable frame (24) is held by the vertical plate (24c) at its left end.

There is a brace (27) between the left wall of the magnet room (25) and the left vertical plate (24c) of the vertically movable frame (24). The brace (27) absorbs the clockwise torque of the vertically movable frame (24). One end of the brace (27) is fixed to the cathode cover (18) and the other end (27a) of the brace (27) slides on the vertical rail (24e) formed on the left side of the left vertical plate (24c), as the vertically movable frame (24) moves up and down. The guide and support mentioned above prevents the vertically movable frame (24) from lateral movement.

In this modified example, the magnet moving gadgets (25A, 25B) are moved vertically and horizontally by the servo motor (21), which permits the accurate position control for the magnet. The vertical movement of the magnet can be accomplished easily by the suspended gadgets (25A, 25B) and the guide to prevent the vertically movable frame (24) from lateral movement. In addition, the vertical movement is independent of horizontal movement and horizontal positioning. For this reason, it is possible to add the vertical moving mechanism with a minimum of cost, while keeping its high reliability and durability.

Figure 16:
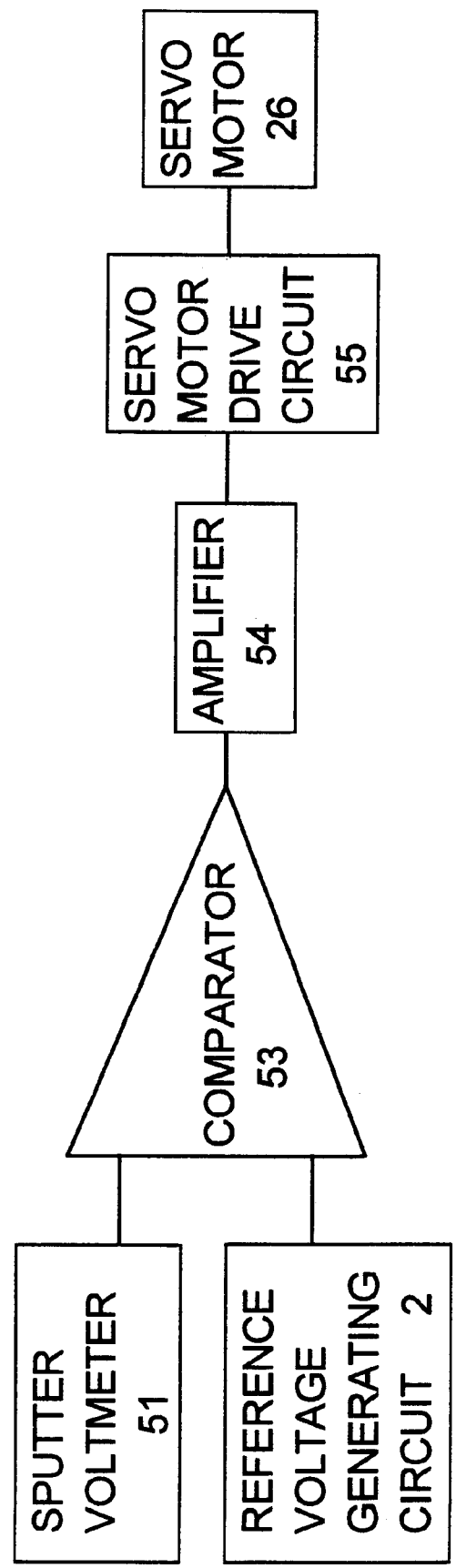
FIG. 16 is a block diagram showing the control system to drive the sputtering magnet vertically in the second modified example.

The vertical movement is controlled by the electrical drive system as shown in FIG. 16. A sputter voltmeter (51) is provided between the DC power source and the first and second electrodes in the sputtering chamber to continuously monitor the sputter voltage while the DC sputtering apparatus is in operation. There is a reference voltage generating circuit (52) whose set value is the sputter voltage desirable for ordinary operation. There is a comparator (53) which receives outputs from the sputter voltmeter (51) and the reference voltage generating circuit (52) and outputs the value of increasward or decreasward deviation of the sputter voltage relative to the reference voltage. The output from the comparator (53) is amplified by the amplifier (54) and then entered into the servo motor drive circuit (55) to control the servo motor (26). Thus the servo motor (26) is driven in response to the fluctuation of the sputter voltage (51). The servo motor (26) turns in such a direction that the vertically movable frame goes down when the sputter voltage is higher than the reference voltage, and vice versa. The servo motor (26) starts within a short period of the order of microseconds after the detection of the fluctuation in the sputter voltage.

In the example explained below, the glass substrate (3) for the array substrate is coated with a 300 nm thick film of molybdenum-tungsten alloy (Mo—W, Mo 50 wt %) for the gate and scanning lines of TFT.

The thin film was deposited under the following conditions, with the sputter magnet (2) reciprocated three times to ensure uniform film thickness.

Reference voltage for the sputter voltage: 550V
Sputter gas: argon (Ar)
Pressure in the sputtering chamber (1): 0.6 Pa
Temperature of the second electrode (14): 200° C.

Figure 17:
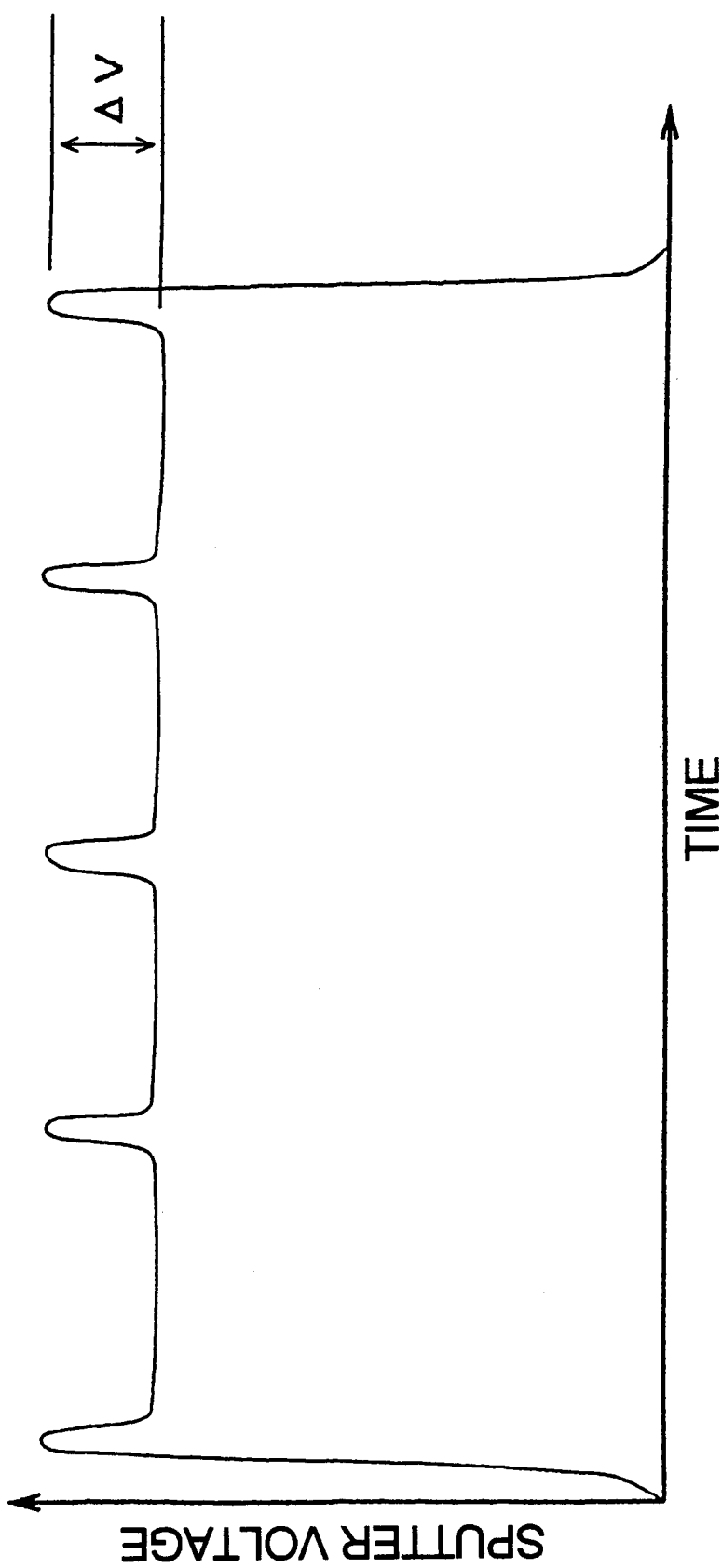
FIG. 17 is a graph showing the fluctuation of the sputtering voltage in the DC magnetron sputtering apparatus used in comparative example.
Figure 18:
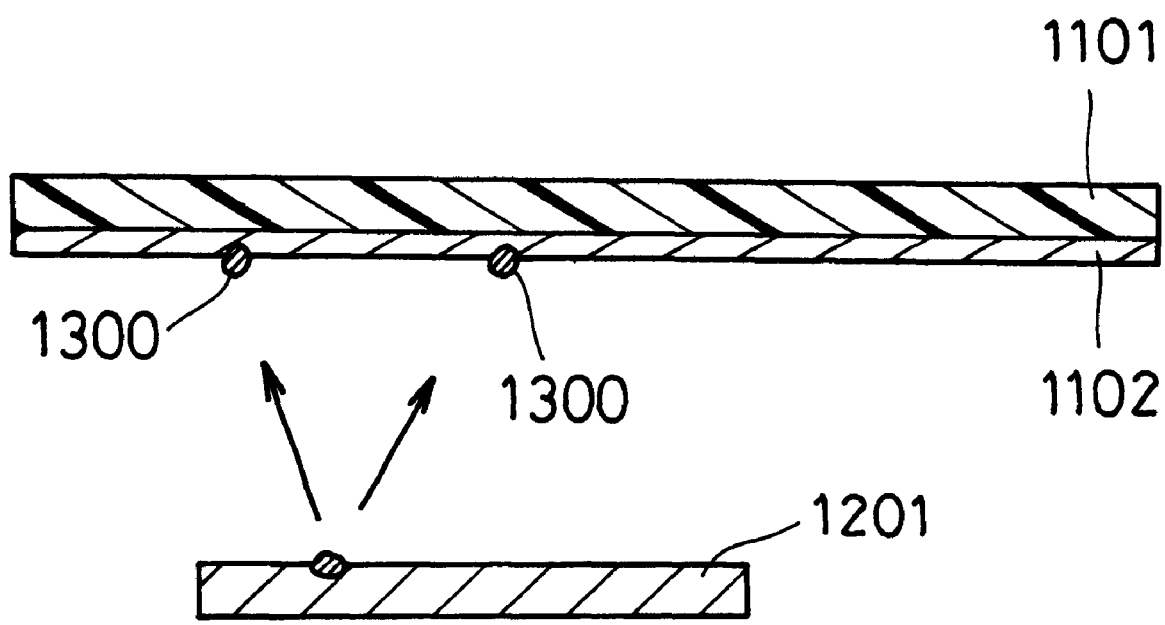
FIG. 18 is a schematic diagram to illustrate splash.

The fluctuation in sputter voltage was recorded during deposition and the thin film deposited in this manner was examined for sheet resistivity and its variation. The results are shown in Table 6. Incidentally, the sputtering apparatus in referential example gave the sputter voltage which fluctuated with horn-shaped peaks as schematically shown in FIG. 17.

TABLE 6

Fluctuation in sputter voltage and sheet resistivity

| | Modified example | Referential example |
|---|---|---|
| Vertical movement of sputter magnet | Yes | No |
| Range of fluctuation (peak) in sputter voltage | Less than 10 V | 100–150 V |
| Sheet resistivity and its variation | 0.44 Ω/□, ± 6.4% | 0.47 Ω/□, ± 9.9% |

It is noted from Table 6 that the process according to the modified example makes it possible to reduce the fluctuation of the sputter voltage to less than one-tenth and hence it is possible to reduce the variation of the sheet resistivity to about two-thirds. Small variation in sheet resistivity implies that the thin film is uniform in quality. The sheet resistivity itself is decreased in the reason that, because of no occurrence of rise in sputter voltage, there is no occurrence of rise in sheet resistivity, which leads to smaller average value.

Array substrates for the display device were produced according to the conventional process except that the first metal layer containing scanning and gate lines was formed by sputtering as specified in Table 1. They were good in quality and yields without defective etching resulting from poor film quality.

As mentioned above, the uniformity of the quality of the sputtered thin film is greatly improved by employing the mechanism which detects the fluctuation in sputter voltage and automatically adjusts the distance between the sputter magnet and the target electrode.

In the modified example, the mechanism is designed such that the sputter magnet moves up and down according to the fluctuation in sputter voltage. This mechanism may be changed such that the gadget (25B) for vertical movement moves in synchronism with the gadget (25A) for horizontal movement so that the sputter magnet goes down only when it comes to the ends of its reciprocal movement. In this case, the sputter voltage changes as the magnet-target distance changes due to consumption of the target material as the first electrode (13) and hence it is necessary to change the set position for the gadget (25B) for vertical movement according to the change in sputter voltage which is measured periodically.

What is claimed is:

1. A method of forming a fine wiring pattern, comprising the steps of:

arranging an insulating substrate on a grounded second electrode of a sputtering apparatus including a first electrode formed of a target material disposed opposed to the insulating substrate and a magnet disposed on a back surface of the first electrode;

depositing by sputtering on the insulating substrate a thin film of an aluminum or an aluminum alloy comprising more than 70 atomic percentage aluminum;

patterning said thin film; and forming a fine wiring pattern, wherein said depositing occurs under a condition configured to prevent a splash occurrence on said thin film by maintaining a potential difference between the first electrode and the grounded second electrode lower than 570V and by maintaining a power density of at least 22 W/cm$^2$, said power density being controlled by at least one of a distance between said first and second electrodes and a distance between said first electrode and said magnet.

2. A method of forming a fine wiring pattern according to claim 1, wherein said step of forming a fine wiring pattern forms a wiring width smaller than 30 $\mu$m or a wiring space smaller than 60 $\mu$m.

3. A method of forming a fine wiring pattern according to claim 2, wherein said step of forming a fine wiring pattern forms a wiring pattern from an aluminum alloy containing at least one element selected from the group consisting of neodymium, yttrium, and gadolinium in a total amount of 0.3 to 5.0 atomic percentage.

4. A method of forming a fine wiring pattern according to claim 2, wherein said step of arranging an insulating substrate comprises arranging an array substrate of a flat-panel display device while said step of forming a fine wiring pattern forms a pattern of signal lines configured to supply drive signals to pixels arranged on said array substrate.

5. A method of forming a fine wiring pattern according to claims 2 or 4, wherein said step of forming a fine wiring pattern forms a pattern of wirings arranged at a pitch smaller than 0.36 mm.

6. A method of forming a fine wiring pattern according to claim 2, wherein said step of depositing by sputtering occurs in a pressure range from 0.4 to not higher than 1.4 Pa.

7. A method of forming a fine wiring pattern according to claim 5, wherein said step of depositing by sputtering occurs in a sputtering atmosphere of argon.

8. A method of forming a fine wiring pattern according to claim 1, wherein said step of depositing comprises the steps of:

detecting a deviation of voltage between said first and second electrodes from a predetermined range;

cutting off a power supply configured to induce said potential difference between the first and second electrodes whenever said deviation of voltage is detected; and resuming the power supply when a predetermined time lapses after said cutting off.

9. A method of forming a fine wiring pattern according to claim 8, wherein said step of resuming the power supply when a predetermined time lapses is a step of:

resuming the power supply within a predetermined time range of 5 to 15 $\mu$s.

10. A method of forming a fine wiring pattern according to claims 8 or 9, wherein said step of cutting off comprises the step of:

cutting off the power supply within 1 $\mu$s after said detecting deviation of voltage wherein said deviation of voltage incurrs by an arc discharge.

11. A method of forming a fine wiring pattern according to claim 8, wherein said step of detecting deviation of voltage is monitored throughout said step of depositing.

12. A method of forming a fine wiring pattern according to claim 1, said step of depositing by sputtering is comprises the steps of detecting deviation of voltage between said first and second electrodes from a predetermined range; and adjusting said distance between the first electrode and said magnet so as to control the voltage within the predetermined range.

13. The method of claim 1, wherein the arranging step comprises locating an insulating substrate having an area greater than 300×400 mm on the grounded second electrode.

* * * * *